(12) United States Patent
Tangring

(10) Patent No.: US 12,284,847 B2
(45) Date of Patent: Apr. 22, 2025

(54) OPTOELECTRONIC COMPONENT AND METHOD FOR MANUFACTURING AN OPTOELECTRONIC COMPONENT

(71) Applicant: OSRAM Opto Semiconductors GmbH, Regensburg (DE)

(72) Inventor: Ivar Tangring, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 589 days.

(21) Appl. No.: 17/633,051

(22) PCT Filed: Sep. 3, 2020

(86) PCT No.: PCT/EP2020/074593
§ 371 (c)(1),
(2) Date: Feb. 4, 2022

(87) PCT Pub. No.: WO2021/043901
PCT Pub. Date: Mar. 11, 2021

(65) Prior Publication Data
US 2022/0271202 A1 Aug. 25, 2022

(30) Foreign Application Priority Data
Sep. 5, 2019 (DE) .......................... 102019123886.2

(51) Int. Cl.
*H10H 20/85* (2025.01)
*H10H 20/01* (2025.01)
(Continued)

(52) U.S. Cl.
CPC ........ *H10H 20/8502* (2025.01); *H10H 20/01* (2025.01); *H10H 20/851* (2025.01);
(Continued)

(58) Field of Classification Search
CPC ....... H01L 33/486; H01L 33/54; H01L 33/62; H01L 33/52; H01L 33/56; H01L 33/50;
(Continued)

(56) References Cited

U.S. PATENT DOCUMENTS 9,035,340 B2 5/2015 Kim et al.
9,337,388 B2 5/2016 Hertkorn et al.
(Continued)

FOREIGN PATENT DOCUMENTS

CN 103155180 A 6/2013
DE 112011103144 T5 7/2013
(Continued)

OTHER PUBLICATIONS

P. Praveen et al., "Structural, optical and morphological analyses of pristine titanium di-oxide nanoparticles—Synthesized via sol-gel route," Spectrochimica Acta Part A: Molecular and Biomolecular Spectroscopy 117 (2014) 622-629. (Year: 2014).*

*Primary Examiner* — Peter M Albrecht
(74) *Attorney, Agent, or Firm* — Slater Matsil, LLP

(57) ABSTRACT

In an embodiment an optoelectronic component includes a carrier with a mounting area, an optoelectronic semiconductor chip, a dielectric protective layer and a dielectric encapsulation, wherein the protective layer is directly located at the mounting area in a chip mounting region, wherein the semiconductor chip is located at the protective layer in the chip mounting region and is electrically conductively connected with the carrier, wherein the encapsulation is directly located at the mounting area in a region adjacent to the chip mounting region and is directly located at the protective layer in an overlap region, and wherein the encapsulation is arranged exclusively in the region adjacent to the semiconductor chip.

17 Claims, 4 Drawing Sheets

(51) Int. Cl.
*H10H 20/851* (2025.01)
*H10H 20/853* (2025.01)
*H10H 20/857* (2025.01)

(52) U.S. Cl.
CPC ........ *H10H 20/853* (2025.01); *H10H 20/857* (2025.01); *H10H 20/0362* (2025.01); *H10H 20/0364* (2025.01)

(58) Field of Classification Search
CPC .............. H01L 33/507; H10H 20/8502; H10H 20/851; H10H 20/8515; H10H 20/852; H10H 20/853; H10H 20/854; H10H 20/857
See application file for complete search history.

(56) References Cited

U.S. PATENT DOCUMENTS

| | | |
|---|---|---|
| 10,230,031 B2 | 3/2019 | Haiberger et al. |
| 2012/0018759 A1* | 1/2012 | Ohta ........................ H01L 33/60 257/98 |
| 2013/0207144 A1* | 8/2013 | Ramchen ................ H01L 33/56 257/98 |
| 2014/0117396 A1 | 5/2014 | Eisert et al. |
| 2015/0311403 A1 | 10/2015 | Katoh et al. |
| 2016/0155905 A1 | 6/2016 | Amo et al. |
| 2018/0035548 A1 | 2/2018 | Landesberger et al. |
| 2018/0053883 A1 | 2/2018 | Yajima et al. |
| 2023/0358685 A1* | 11/2023 | Nishizawa ............. G01N 21/87 |

FOREIGN PATENT DOCUMENTS

| | | |
|---|---|---|
| DE | 102015103840 A1 | 9/2016 |
| DE | 102016213878 B3 | 11/2017 |
| DE | 102016111566 A1 | 12/2017 |
| DE | 102018119444 A1 | 2/2020 |
| WO | 2009075530 A2 | 6/2009 |
| WO | 2018138370 A1 | 8/2018 |

\* cited by examiner

OPTOELECTRONIC COMPONENT AND METHOD FOR MANUFACTURING AN OPTOELECTRONIC COMPONENT

This patent application is a national phase filing under section 371 of PCT/EP2020/074593, filed Sep. 3, 2020, which claims the priority of German patent application 102019123886.2, filed Sep. 5, 2019, each of which is incorporated herein by reference in its entirety.

TECHNICAL FIELD

An optoelectronic component and a method for manufacturing an optoelectronic component are specified.

SUMMARY OF THE INVENTION

Embodiments provide an optoelectronic component in which the carrier is well protected from corrosion. Further embodiments provide a method for manufacturing such an optoelectronic component.

First, the optoelectronic component is described.

According to at least one embodiment, the optoelectronic component comprises a carrier with a mounting area. The mounting area forms an upper side of the carrier or at least a portion of an upper side of the carrier. For example, the mounting area is a bottom surface in a recess of the carrier. Preferably, the mounting area is flat or substantially flat. The carrier is the or one component stabilizing the structural member.

According to at least one embodiment, the optoelectronic component comprises an optoelectronic semiconductor chip. Preferably, the semiconductor chip emits electromagnetic primary radiation during intended operation, for example in the visible spectral range or in the UV region or in the infrared region. The optoelectronic component is in particular an LED. The optoelectronic component can be used, for example, in a headlight, for example of a motor vehicle, or in a flash light, for example of a cell phone.

A semiconductor chip is understood here and in the following as an element that can be handled separately and electrically contacted. A semiconductor chip is created by separation from a wafer composite. In particular, side surfaces of such a semiconductor chip then comprise, for example, traces from the separation process of the wafer composite. A semiconductor chip preferably comprises exactly one originally coherent region of a semiconductor layer sequence grown in the wafer compound. The semiconductor layer sequence of the semiconductor chip is preferably adapted to be contiguous. The extension of the semiconductor chip, measured parallel to the main extension plane of the semiconductor chip, is, for example, at most 5% or at most 10% or at most 20% larger than the extension of the semiconductor layer sequence, measured parallel to the main extension plane of the semiconductor layer sequence.

The semiconductor layer sequence of the semiconductor chip is based on, for example, a III-V compound semiconductor material, in particular a nitride compound semiconductor material. The semiconductor layer sequence includes an active layer in which, for example, the primary electromagnetic radiation is generated in the intended operation. In particular, the active layer includes at least one pn junction and/or at least one quantum well structure in the form of a single quantum well, abbreviated as SQW, or in the form of a multi-quantum well structure, abbreviated as MQW.

According to at least one embodiment, the optoelectronic component comprises a dielectric protective layer and a dielectric encapsulation. The protective layer and/or the encapsulation are preferably transparent or translucent to the primary radiation and/or to a secondary radiation generated in the component. For example, the protective layer comprises a thickness anywhere along its extension between 5 nm and 500 nm inclusive, preferably between 5 nm and 200 nm inclusive, more preferably between 20 nm and 200 nm inclusive. In particular, a layer comprises a substantially constant thickness along its entire extension with deviations of at most 30% from the average thickness.

According to at least one embodiment, the protective layer is applied directly to the mounting area in a chip mounting region. The protective layer is preferably adapted to be continuous and without interruptions. The chip mounting region is smaller than the mounting area. The chip mounting region of the carrier is preferably at least partially formed by metal. The protective layer preferably covers the entire chip mounting region. In particular, the protective layer serves to protect the underlying carrier from corrosion.

According to at least one embodiment, the semiconductor chip in the chip mounting region is applied to the protective layer and electrically conductively connected with the carrier. For example, the semiconductor chip is bonded to the protective layer. The semiconductor chip is preferably smaller in its lateral dimensions, measured parallel to the mounting area, than the protective layer. Preferably, the semiconductor chip is applied to the protective layer such that, as viewed in a top view of the mounting area, the protective layer protrudes all around the semiconductor chip. Preferably, the protective layer extends continuously throughout the region between the carrier and the semiconductor chip without interruptions.

The semiconductor chip is electrically conductively connected with the carrier. Preferably, the semiconductor chip can be electrically contacted and energized via the carrier. For example, the carrier comprises contact points or soldering areas on a rear face opposite the mounting area for external electrical contacting of the component.

According to at least one embodiment, the encapsulation is applied directly to the mounting area in a region adjacent to the chip mounting region. In an overlap region, the encapsulation is further applied directly to the protective layer. That is, in the overlap region, a portion of the protective layer is arranged between the carrier and the encapsulation. The encapsulation is preferably adapted to be continuous and uninterrupted from the region adjacent to the chip mounting region to the overlap region.

The encapsulation serves to protect the mounting area from corrosion in the region adjacent to the chip mounting region. The encapsulation is preferably applied to a metallic region of the mounting area. Particularly preferably, the protective layer and the encapsulation are applied to the mounting area in such a way that together they cover all metallic regions of the mounting area, preferably even the entire mounting area. In the overlap region, an interface is adapted between the protective layer and the encapsulation, which is visually visible, for example, with the aid of a microscope.

The component may comprise one or more further optoelectronic semiconductor chips. All specifications made here and in the following with respect to the one semiconductor chip may apply accordingly to the further semiconductor chip or chips. In particular, the at least one further semiconductor chip may be arranged in the chip mounting region on the same protective layer as the semiconductor chip.

Further, the component may comprise an ESD protection diode. This is, for example, covered by the protective layer and/or the encapsulation.

In at least one embodiment, the optoelectronic component comprises a carrier with a mounting area, an optoelectronic semiconductor chip, a dielectric protective layer, and a dielectric encapsulation. The protective layer is directly applied to the mounting area in a chip mounting region. The semiconductor chip is applied to the protective layer in the chip mounting region and electrically conductively connected with the carrier. The encapsulation is applied directly to the mounting area in a region adjacent to the chip mounting region and is applied directly to the protective layer in an overlap region.

In particular, embodiments of the present invention are based on the realization that to protect a carrier from corrosion, it is usually covered with a dielectric protective layer after a semiconductor chip is applied. As a result, the semiconductor chip is also covered with the protective layer, which usually limits the materials that can be used for the protective layer to low-refractive-index materials so as not to reduce the coupling out efficiency from the semiconductor chip too much. Secondly, an edge or air gap is usually adapted between the semiconductor chip and the carrier, which cannot be reliably covered with the protective layer. When the protective layer is applied, the protective layer often cracks in the region of the edge or air gap, so that the carrier is not protected against corrosion in this region.

In embodiments of the present invention, use is made of a protective layer arranged below the semiconductor chip on the carrier to protect the carrier from corrosion in this region. The remaining regions of the mounting area of the carrier are covered with an encapsulation different from the protective layer, which may itself be a layer. The use of an encapsulation different from the protective layer allows electrical contacting of the semiconductor chip with the carrier, because the encapsulation can be applied after electrical contacting of the carrier. The overlap region, in which the encapsulation lies directly on the protective layer, guarantees that sufficient corrosion protection is provided in the transition region between the protective layer and the encapsulation.

According to at least one embodiment, the mounting area comprises at least one electrical connection region in the region adjacent to the chip mounting region. The connection region is adapted in particular to be metallic. This connection region forms part of the mounting area of the carrier. The connection region is not covered by the protective layer.

According to at least one embodiment, the semiconductor chip is electrically conductively connected to the connection region via an electrically conductive connecting element. The connecting element connects a contact region of the semiconductor chip with the connection region. The contact region of the semiconductor chip is preferably formed on a side of the semiconductor chip facing away from the carrier. The connecting element is, for example, a contact wire or a conductor path.

According to at least one embodiment, the electrically conductive connecting element is at least partially embedded in the encapsulation. The encapsulation is preferably in direct contact with the connecting element, at least in some regions, and surrounds the connecting element there in a form-fitting manner. In particular, the region of the connecting element closest to the connection surface is embedded in the encapsulation. The encapsulation particularly preferably covers the entire connection surface and is applied directly to the connection surface.

By embedding the connecting element and covering the connection surface with the encapsulation, the carrier is protected from corrosion in this region.

According to at least one embodiment, the optoelectronic semiconductor chip is a volume emitter, for example a sapphire chip or a flip chip. In this case, the semiconductor chip in particular still comprises the growth substrate on which the semiconductor layer sequence of the semiconductor chip is grown. The growth substrate may be sapphire. In the intended operation of the semiconductor chip, radiation is then emitted both via a main emission side and via side surfaces of the semiconductor chip extending transversely to the main emission side. For example, at least 20% of the primary radiation generated in the semiconductor chip during operation is emitted via the main emission side and at least 10% is emitted from the semiconductor chip via each of the side surfaces. The semiconductor chip is mounted on the mounting area in particular such that the main emission side faces away from the mounting area. The side surfaces of the semiconductor chip extend transversely or perpendicularly to the mounting area.

According to at least one embodiment, the mounting area is at least partially formed of silver. In particular, the carrier comprises a leadframe coated with silver in the region of the mounting area. For example, at least part of the chip mounting region and/or the entire connection region are formed of silver. Preferably, at least 25% or at least 50% of the area of the mounting area is formed of silver. Due to the silver-containing mounting area, a high degree of reflection for visible light in particular is provided. However, silver is particularly susceptible to corrosion, so that good protection of the mounting area against corrosion is particularly important.

According to at least one embodiment, the protective layer and the encapsulation are formed from different materials. Alternatively, the protective layer and encapsulation may be formed of the same material, wherein there is nevertheless an interface between the protective layer and the encapsulation in the overlap region resulting from the protective layer and the encapsulation having been successively applied to the carrier and cured or hardened.

According to at least one embodiment, the encapsulation is a layer. The thickness of the layer is preferably less than the thickness of the semiconductor chip. The thickness of the semiconductor chip is its extension perpendicular to the mounting area. Thus, in the region adjacent to the semiconductor chip, the encapsulation does not protrude the semiconductor chip in the direction away from the carrier. The specifications made for the protective layer with respect to thickness can apply accordingly to the encapsulation. Preferably, the thickness of the encapsulation layer is chosen to be greater than that of the protective layer. This enables better corrosion protection to be achieved in the region adjacent to the semiconductor chip. A comparatively thinner protective layer has the advantage of good thermal connection of the semiconductor chip to the carrier.

The encapsulation can also be applied to the semiconductor chip. For example, the encapsulation completely covers the semiconductor chip.

According to at least one embodiment, the optoelectronic component comprises potting compound. The semiconductor chip is embedded in the potting compound. The potting compound is at least applied to the encapsulation, in particular directly applied. The encapsulation and the protective layer are preferably formed from a different material or comprise a different material than the potting compound. For example, the potting compound is based on silicone, in particular clear silicone. Parts of the electrically conductive connecting element that are not embedded in the encapsulation are embedded in the potting compound, for example.

The potting compound may comprise phosphor particles that serve to convert the primary radiation emitted by the semiconductor chip during operation into secondary radiation. These may be sedimented in the potting compound, for example. Alternatively, the potting compound may be completely transparent to the primary radiation and/or to a secondary radiation.

According to at least one embodiment, the overlap region extends laterally completely around the semiconductor chip. That is, when viewed from above the mounting area, the overlap region forms a continuous frame without interruptions around the semiconductor chip.

According to at least one embodiment, the semiconductor chip is configured to generate primary electromagnetic radiation during operation. Preferably, the component comprises a conversion element configured to convert at least a portion of the primary radiation into a secondary radiation during operation. The conversion element may be formed by the potting compound, as explained above. Alternatively, the conversion element may be formed by a layer of conversion material on the semiconductor chip. For example, the conversion element may be a ceramic conversion element or may be formed by a powder on the semiconductor chip.

According to at least one embodiment, the protective layer comprises a higher reflectivity for the primary radiation than for the secondary radiation. Both the primary radiation and the secondary radiation have a dominant wavelength at which the respective radiation comprises a global intensity maximum. In particular, the reflectivities relate to these dominant wavelengths. For example, the dominant wavelengths of the primary radiation and the secondary radiation differ by at least 50 nm or at least 100 nm. For example, the reflectivity of the protective layer for the primary radiation is at least 10% or at least 50% or at least 100% greater than for the secondary radiation.

According to at least one embodiment, the encapsulation comprises a higher reflectivity for the secondary radiation than for the primary radiation. For example, the reflectivity of the encapsulation is at least 10% or at least 50% or at least 100% greater for the secondary radiation than for the primary radiation.

The different reflectivities and the reflectivities adapted to the respective radiation can be achieved, for example, by a multilayer structure. For example, the protective layer and/or the encapsulation each comprise at least two partial layers. A second partial layer, arranged between the carrier and a first partial layer, comprises a higher refractive index than the first partial layer. For example, the second partial layer comprises a refractive index at least 1.5 times as large or at least twice as large as the first partial layer. For example, the second partial layer is formed of titanium dioxide, whereas the first partial layer may be formed of silicon dioxide. A third partial layer may be present between the second partial layer and the carrier, which is preferably formed of the same material as the first partial layer.

The second partial layer preferably comprises a thickness of approximately $\lambda/4$, for example a thickness between and including $0.9 \cdot \lambda/4$ and $\lambda/4$ or between and including $0.95 \cdot \lambda/4$ and $\lambda/4$, wherein $\lambda$ is the dominant wavelength of radiation to be reflected more strongly. Due to the high refractive index difference from the first partial layer to the second partial layer, all radiation incident from the first partial layer on the second partial layer is refracted toward very small angles. The path length in the second partial layer is then almost independent of the angle of incidence $\lambda/4$, or after reflection $\lambda/2$. Constructive interference can thus be achieved for the desired dominant wavelength.

The thickness of the protective layer and/or the thickness of the encapsulation are preferably greater than half the dominant wavelength of the primary radiation and/or the secondary radiation. For example, the thicknesses of the protective layer and/or the encapsulation are each at least $0.5\lambda$ or at least $\lambda$, wherein $\lambda$ is the dominant wavelength of the primary radiation or the secondary radiation. A thickness of at least $0.5\lambda$ provides improved total internal reflection.

According to at least one embodiment, the protective layer comprises a lower refractive index than the encapsulation. The refractive indices are compared here at the dominant wavelength of the primary radiation. In particular, the real parts of the refractive indices are meant. Also, the respective average refractive index is meant.

For example, the refractive index of the protective layer is at most 95% or at most 90% or at most 80% or at most 70% of the refractive index of the encapsulation. A low refractive index for the protective layer below the semiconductor chip is advantageous in terms of high reflectivity for the primary radiation. In contrast, high reflectivity is less important in the region adjacent to the semiconductor chip/chip mounting region. The encapsulation may be optimized with respect to other physical properties, such as increased protectiveness against corrosion.

According to at least one embodiment, the encapsulation covers the semiconductor chip. For example, the encapsulation extends continuously and without interruptions over the semiconductor chip. Viewed from above the mounting area, the semiconductor chip is, for example, completely covered by the encapsulation. In this way, protection of the semiconductor chip from external influences can also be improved.

According to at least one embodiment, the encapsulation is arranged exclusively in the region next to the semiconductor chip. "Adjacent" refers to a direction parallel to the mounting area. Thus, the encapsulation does not cover the semiconductor chip or does not cover it completely. In particular, the encapsulation does not cover the main emission side of the semiconductor chip. In this case, the encapsulation advantageously does not have to be designed for high transparency for the primary radiation emitted by the semiconductor chip, which increases the eligible materials for the encapsulation and the associated protective effect.

According to at least one embodiment, the protective layer and/or the encapsulation are formed of an inorganic material. For example, the protective layer and/or encapsulation comprise or consist of one or more inorganic oxides or oxinitrides or nitrides. The one or more oxides or oxinitrides or nitrides may comprise one or more elements of the following group: Silicon, Aluminum, Titanium, Zinc, Indium, Tin, Niobium, Tantalum, Hafnium, Zirconium, Yttrium, Germanium. For example, the protective layer and/or encapsulation comprise or consist of silicon oxide, such as $SiO_2$, aluminum oxide, titanium oxide, such as $TiO_2$, zinc oxide, indium oxide, tin oxide, tantalum oxide, niobium oxide, hafnium oxide, zirconium oxide, yttrium oxide, silicon nitride, aluminum nitride, magnesium fluoride, or germanium nitride.

Alternatively, the encapsulation can also be based on an organic material. The encapsulation is then preferably non-transmissive to the primary radiation and/or secondary radiation. For example, the encapsulation is a silicone with scattering particles embedded therein.

According to at least one embodiment, the carrier comprises a leadframe and a dielectric housing body. The leadframe is embedded in the housing body. For example, the housing body comprises a plastic or epoxy. The leadframe preferably comprises at least two sections electrically insulated from each other. The two sections are preferably assigned different electrical polarities or potentials during intended operation of the component. The leadframe comprises, for example, copper.

According to at least one embodiment, the housing body laterally surrounds a recess in which the semiconductor chip is arranged. "Lateral" refers to a direction parallel to the mounting area. The recess may have the shape of a truncated cone or a truncated pyramid. Preferably, the diameter of the recess increases in the direction away from the mounting area.

According to at least one embodiment, the mounting area is formed at least in sections by the leadframe both in the chip mounting region and in the region to which the encapsulation is directly applied. In these regions, the leadframe is preferably coated with silver.

Next, the method for manufacturing an optoelectronic component is described. In particular, the method can be used to manufacture an optoelectronic component as described herein. All features disclosed in connection with the optoelectronic component are therefore also disclosed for the method, and vice versa.

According to at least one embodiment of the method, the method comprises a step A) in which a carrier with a mounting area is provided. In a step B), a dielectric protective layer is adapted on the mounting area in a chip mounting region of the mounting area. In a step C), an optoelectronic semiconductor chip is applied to the protective layer. In a step D), the semiconductor chip is electrically connected with the carrier. In a step E), an encapsulation is applied directly to the mounting area in a region adjacent to the chip mounting region and directly to the protective layer in an overlap region.

Steps A) to E) are preferably carried out in succession in alphabetical order. The protective layer and/or the encapsulation can be applied by means of physical vapor deposition (PVD) or chemical vapor deposition, such as PECVD, or atomic layer deposition (ALD).

According to at least one embodiment, a shadow mask is used in step B) to apply the protective layer in predefined regions of the carrier. An opening of the shadow mask reflects the shape and size of the protective layer to be deposited. The shadow mask can be applied directly to the carrier, thus touching the carrier. In this case, the protective layer can also be applied via sputtering.

According to at least one embodiment, a further shadow mask is used in step E) to apply the encapsulation in predefined regions of the carrier. In particular, the further shadow mask allows the encapsulation to be applied exclusively in regions adjacent to the semiconductor chip. Thus, the semiconductor chip can be protected from being covered with the encapsulation.

Since the further shadow mask should preferably not touch the semiconductor chip and/or the connecting elements and should therefore be kept at a certain distance from the carrier/semiconductor chip, the encapsulation is preferably applied with a directional deposition process, such as PVD in the form of evaporation or laser beam evaporation (English: pulsed laser deposition) or spray coating.

According to at least one embodiment, in step E) the encapsulation is applied over the entire surface of the carrier. For example, no mask is then used to apply the encapsulation. In particular, the encapsulation then also covers the semiconductor chip.

BRIEF DESCRIPTION OF THE DRAWINGS

Further advantageous embodiments and further embodiments of the optoelectronic component and of the method for manufacturing an optoelectronic component result from the exemplary embodiments described below in conjunction with the figures. Elements that are identical, of the same kind or have the same effect are provided with the same reference signs in the figures. The figures and the proportions of the elements shown in the figures are not to be regarded as to scale. Rather, individual elements, in particular layer thicknesses, may be shown exaggeratedly large for better representability and/or understanding.

DETAILED DESCRIPTION OF ILLUSTRATIVE EMBODIMENTS

Figure 1:
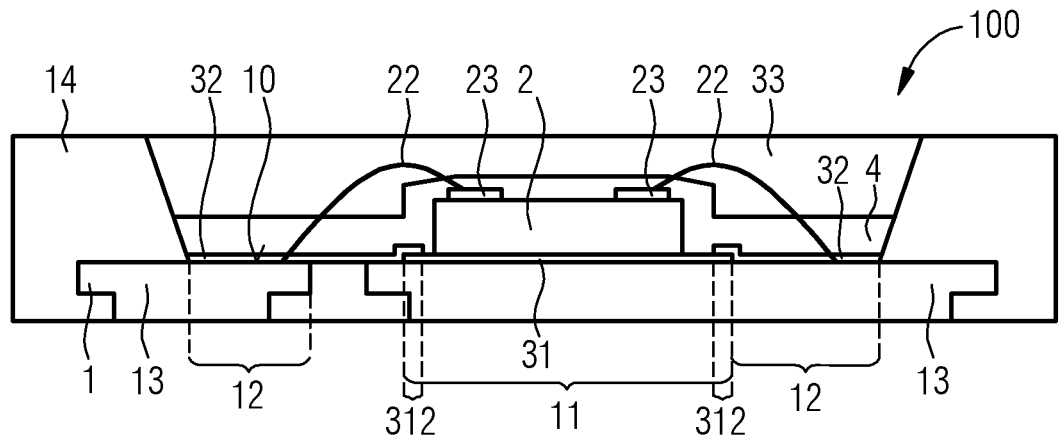
FIGS. 1-4 show exemplary embodiments of the optoelectronic component, each in a cross-sectional view.

FIG. 1 shows a first exemplary embodiment of the optoelectronic component 100 in a cross-sectional view. The component 100 comprises a carrier 1. The carrier 1 comprises a leadframe 13 embedded in a housing body 14. The housing body 14 is formed, for example, from plastic, in particular from an opaque plastic. The leadframe 13 comprises, for example, copper. The leadframe 13 comprises at least two sections which are at different electrical potentials during intended operation of the component 100. At a rear face of the carrier 1, the sections of the leadframe 13 are exposed and serve for external electrical contacting.

The housing body 14 surrounds a recess in a lateral direction. A bottom surface of the recess is formed by a substantially planar mounting area 10 of the carrier 1. An optoelectronic semiconductor chip 2 is mounted in the recess on the mounting area 10. The mounting area 10 is formed in regions by the leadframe 13. In the region of the mounting area 10, the leadframe 13 is coated with silver, for example, to provide high reflectivity for a primary radiation emitted from the semiconductor chip 2.

In operation, the optoelectronic semiconductor chip 2 emits primary radiation, for example in the blue spectral range or in the UV range. The semiconductor chip 2 of FIG. 1 is, for example, a sapphire chip in which a growth substrate of an associated semiconductor layer sequence is formed by sapphire. The growth substrate is then arranged between the carrier 1 and the semiconductor layer sequence.

The semiconductor chip 2 includes two contact regions 23 on a side away from the carrier 1. The contact regions 23 are each electrically conductively connected to electrical connection regions 12 of the mounting area 10 by an electrically conductive connecting element 22 in the form of a contact wire. The connection regions 12 are each formed by a portion of the leadframe 13. In this respect, the semiconductor chip 2 can be electrically contacted via the leadframe 13.

A continuous dielectric protective layer 31 is arranged between the semiconductor chip 2 and the carrier 1. The dielectric protective layer 31 covers a chip mounting region 11 of the mounting area 10 and is in direct contact therewith. In particular, the protective layer 31 is formed of an inorganic material, such as one or more oxides. For example, the protective layer 31 comprises at least one layer of $SiO_2$.

The protective layer 31 comprises a larger lateral extent than the semiconductor chip 2, such that the protective layer 31 protrudes laterally from the semiconductor chip 2. However, the protective layer 31 does not cover the entire mounting area 10 of the carrier 1. In particular, the connection regions 12 are not covered by the protective layer 31 where they are connected with the connecting elements 22.

An encapsulation 32 is applied directly to the mounting area 10 on the regions adjacent to the chip mounting region 11. The encapsulation 32 is also directly applied to the protective layer 31 in an overlap region 312. The connecting elements 22 are at least partially embedded in the encapsulation 32.

The encapsulation 32 in the present case is also a layer, preferably of an inorganic material. For example, the encapsulation 32 is made of the same material as the protective layer 31. The protective layer 31 and the encapsulation 32 together cover all regions of the mounting area 10 formed from the leadframe 13, in particular from the silver of the leadframe 13, and thus protect the leadframe 13 from corrosion.

A conversion element 4 is arranged on the semiconductor chip 2 and in the region adjacent to the semiconductor chip 2. The encapsulation 32 and the protective layer 31 are located between the carrier 1 and the conversion element 4. In the intended operation, the conversion element 4 converts at least part of the primary radiation emitted by the semiconductor chip 2 into a longer-wave secondary radiation different therefrom. The remainder of the recess is filled with a potting compound 33, for example in the form of a clear silicone.

Figure 2:
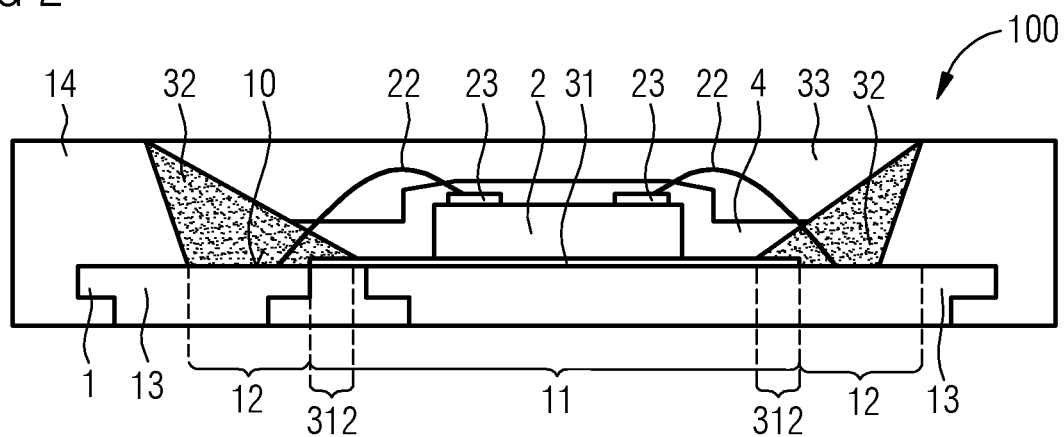

In FIG. 2, a second exemplary embodiment of the optoelectronic component 100 is shown. The exemplary embodiment of FIG. 2 differs from that of FIG. 1 in that no layer of an inorganic material is used for the encapsulation 32, but rather a potting of an organic material, for example an opaque silicone. However, also in this case the encapsulation 32 is applied directly to the mounting area 10 in the region adjacent to the chip mounting region 11 and overlaps with the protective layer 31 in an overlap region 312. Furthermore, the electrically conductive connecting elements 22 are at least partially embedded in the encapsulation 32.

Figure 3:
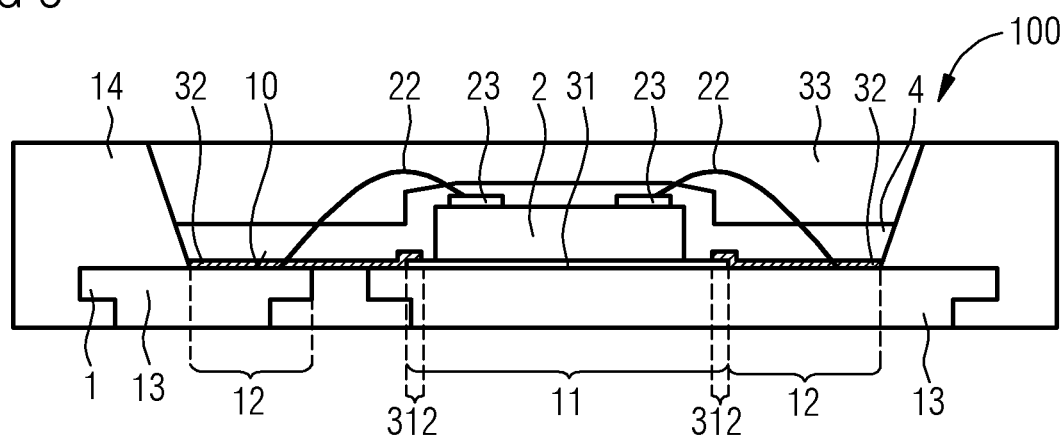

In FIG. 3, a third exemplary embodiment is shown. This corresponds essentially to the exemplary embodiment of FIG. 1, with the difference that now the encapsulation 32 is formed as a layer which consists of a different material or comprises a different material than the protective layer 31. For example, here the protective layer 31 has a higher reflectivity for the primary radiation than for the secondary radiation, whereas the encapsulation 32 comprises a higher reflectivity for the secondary radiation than for the primary radiation.

Figure 4:
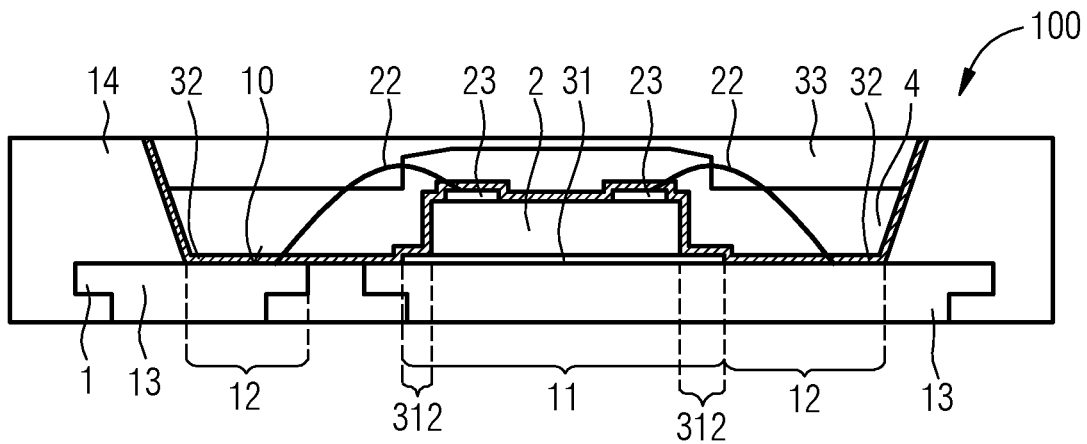

In each of the exemplary embodiments of FIGS. 1 to 3 described so far, the encapsulation 32 is arranged exclusively in the regions adjacent to the semiconductor chip 2, so that the encapsulation 32 does not cover the semiconductor chip 2. In the fourth exemplary embodiment of FIG. 4, on the other hand, the encapsulation 32 is adapted as a continuous layer without interruptions, which extends both in the regions adjacent to the semiconductor chip 2 and the chip mounting region 11 and across the semiconductor chip 2. This provides additional protection to the semiconductor chip 2. For example, the encapsulation 32 is again formed by an inorganic material, such as $SiO_2$.

Figure 5A:
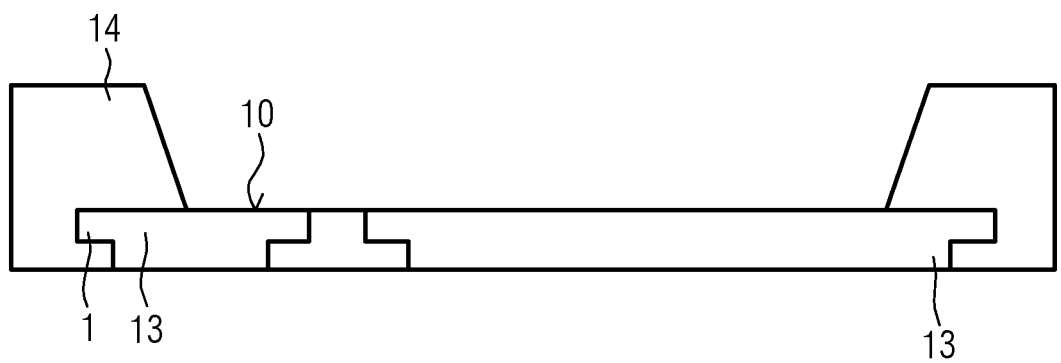
FIGS. 5A-5G show an exemplary embodiment of the method on the basis of views of various intermediate positions in the method.

In FIG. 5A, a position in an exemplary embodiment of the method is shown. In this position, a carrier 1 comprising a leadframe 13 and a housing body 14, as also described in connection with the previous exemplary embodiments, is provided.

Figure 5B:
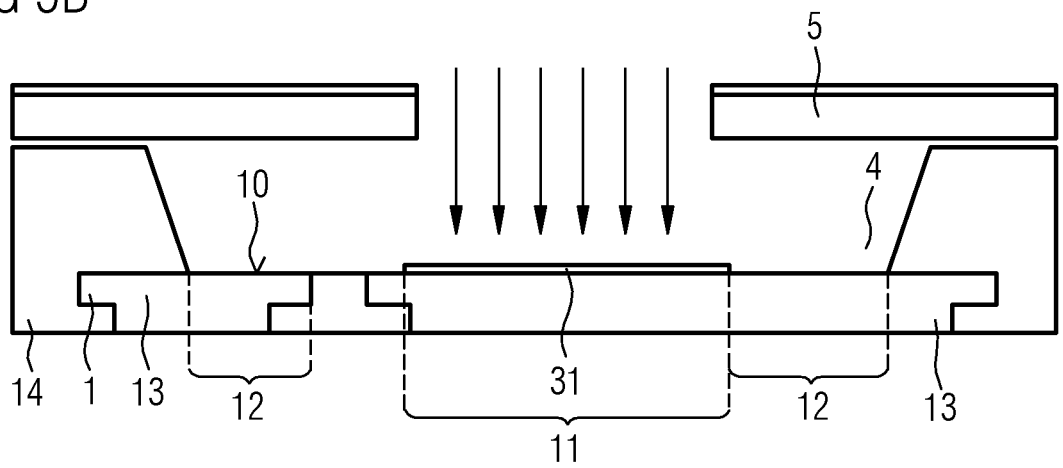

In the subsequent position of the method shown in FIG. 5B, a dielectric protective layer 31 is deposited on a chip mounting region 11 of the mounting area 10 directly on the mounting area 10 with the aid of a shadow mask 5. The shadow mask 5 is configured such that the protective layer 31 covers only a portion of the mounting area 10, and electrical connection regions 12 adjacent to the chip mounting region 11 remain free of the protective layer 31. The shadow mask can be applied directly to the mounting area 10 for depositing the protective layer 31, which then allows many different deposition techniques to be considered.

Figure 5C:
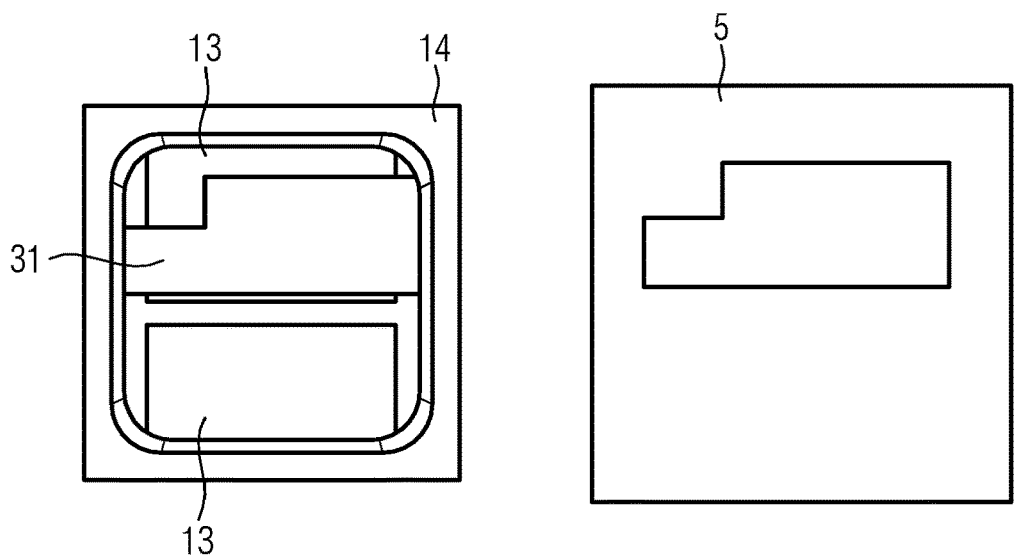

In FIG. 5C, the left figure shows the result after applying the protective layer 31. Here, a top view of the mounting area 10 is selected. The recess surrounded by the housing body 14 comprises a rectangular cross-sectional area. The protective layer 31 partially covers a first section of the leadframe 13, and the second section is free of the protective layer 31. A cutout for a contact is left free at the first section of the leadframe 13.

In the right figure of FIG. 5C, the shadow mask 5 is shown with which a protective layer 31 is producible as shown in the left figure.

Figure 5D:
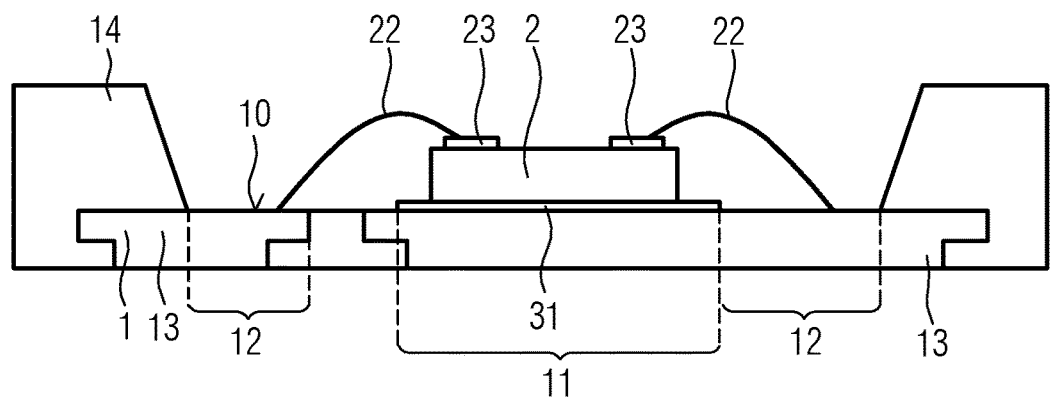

In the FIG. 5D, a position in the method in which an optoelectronic semiconductor chip 2 is applied to the protective layer 31 is shown. In addition, the semiconductor chip 2 is electrically conductively connected to the exposed electrical connection regions 12 of the mounting area 10 via connecting elements 22 in the form of contact wires.

Figure 5E:
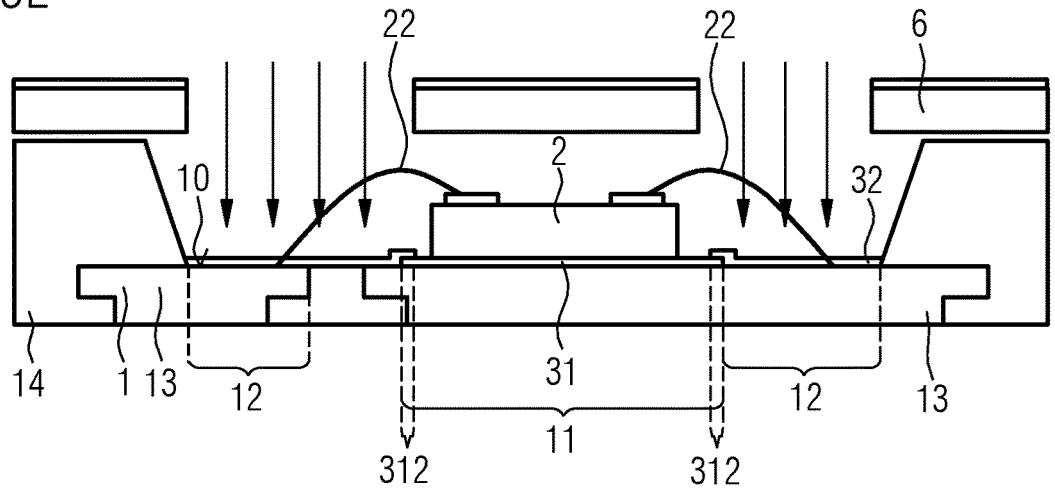

In the position of FIG. 5E it is shown how, with the aid of a further shadow mask 6, an encapsulation 32 is now applied in the region adjacent to the semiconductor chip 2, wherein the further shadow mask 6 prevents the semiconductor chip 2 from being covered with the encapsulation 32. In particular, the encapsulation 32 is adapted directly onto the mounting area 10 in the region adjacent to the chip mounting region 11 and overlapping with the protective layer 31. Preferably, the encapsulation 32 is applied only after the protective layer 31 has cured or hardened. In this process, the contact wires 22 are partially embedded in the encapsulation 32. In particular, with the protective layer 31 and the encapsulation 32, all regions of the mounting area 10 formed by the leadframe 13 are covered and thus protected from corrosion.

Figure 5F:
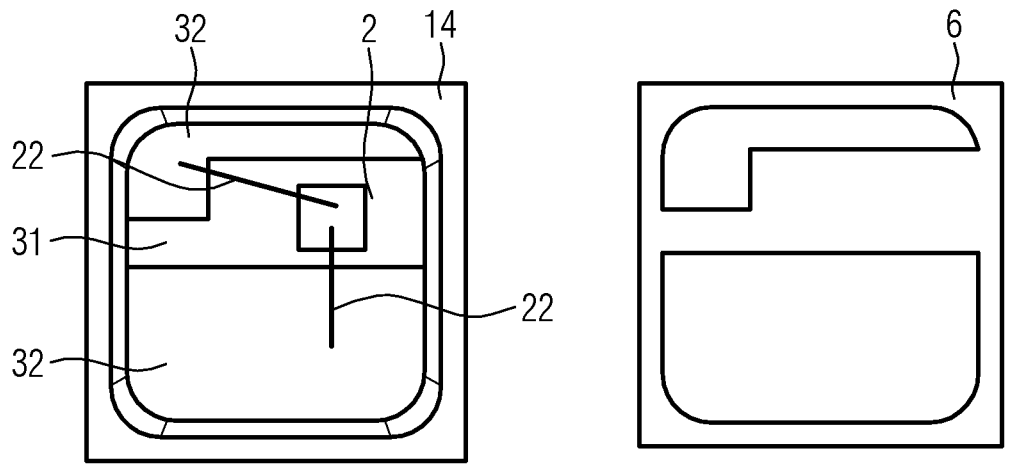

In FIG. 5F, left figure, a top view of the mounting area 10 after forming the encapsulation 32 is shown. In the right figure, the further shadow mask 6 used for this purpose is shown. As can be seen in the left figure, the encapsulation 32 and the protective layer 31 cover all regions of the leadframe 13.

Figure 5G:
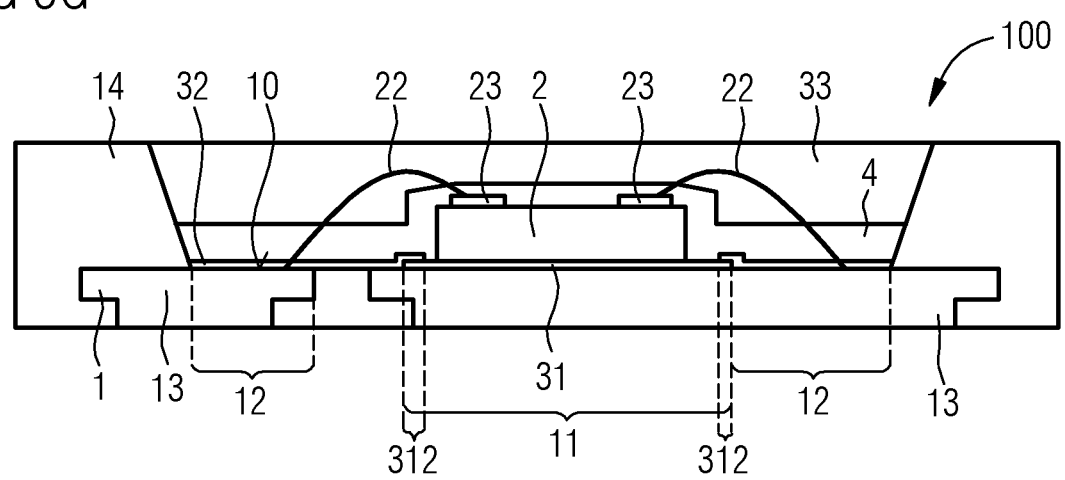

FIG. 5G shows another position in the method in which the optoelectronic component 100 is completed. For this purpose, a conversion element 4 and a potting compound 33 have been filled into the recess.

The invention is not limited to the exemplary embodiments by the description thereof. Rather, the invention encompasses any new feature as well as any combination of features, which in particular includes any combination of features in the patent claims, even if these features or this combination itself is not explicitly specified in the patent claims or exemplary embodiments.

The invention claimed is:

1. An optoelectronic component comprising:
a carrier with a mounting area;
an optoelectronic semiconductor chip;
a conversion element;
a dielectric protective layer; and
a dielectric encapsulation,
wherein the protective layer is directly located at the mounting area in a chip mounting region,
wherein the semiconductor chip is located at the protective layer in the chip mounting region and is electrically conductively connected with the carrier,
wherein the encapsulation is directly located at the mounting area in regions adjacent to the chip mounting region and is directly located at the protective layer in an overlap region,
wherein the encapsulation is arranged exclusively in the regions adjacent to the semiconductor chip,
wherein the semiconductor chip is configured to generate a primary electromagnetic radiation,
wherein the conversion element is configured to convert at least a portion of the primary radiation into a secondary radiation,
wherein the protective layer has a higher reflectivity for the primary radiation than for the secondary radiation, and
wherein the encapsulation has a higher reflectivity for the secondary radiation than for the primary radiation.

2. The optoelectronic component according to claim 1, wherein the mounting area comprises at least one electrical connection region in the regions adjacent to the chip mounting region,
wherein the semiconductor chip is electrically conductively connected to the connection region via an electrically conductive connecting element, and
wherein the electrically conductive connecting element is at least partially embedded in the encapsulation.

3. The optoelectronic component according to claim 1, wherein the mounting area comprises silver.

4. The optoelectronic component according to claim 1, wherein the protective layer and the encapsulation comprise different materials.

5. The optoelectronic component according to claim 1, wherein the encapsulation is a layer whose thickness is less than a thickness of the semiconductor chip.

6. The optoelectronic component according to claim 1, further comprising:
a potting compound,
wherein the semiconductor chip is embedded in the potting compound,
wherein the potting compound is located at least at the encapsulation, and
wherein the encapsulation and the protective layer comprise a different material or comprise a different material than the potting compound.

7. The optoelectronic component according to claim 1, wherein the overlap region extends laterally completely around the semiconductor chip.

8. The optoelectronic component according to claim 1, wherein the protective layer comprises a lower refractive index than the encapsulation.

9. The optoelectronic component according to claim 1, wherein the protective layer comprises an inorganic material.

10. The optoelectronic component according to claim 1, wherein the encapsulation comprises an inorganic material.

11. The optoelectronic component according to claim 1,
wherein the carrier comprises a leadframe and a dielectric housing body in which the leadframe is embedded,
wherein the housing body laterally surrounds a recess in which the semiconductor chip is arranged, and
wherein the mounting area is formed at least in sections by the leadframe both in the chip mounting region and in the regions to which the encapsulation is directly applied.

12. The optoelectronic component according to claim 1, wherein the encapsulation is a layer comprising a constant thickness over its entire extension with deviations of at most 30% from an average thickness.

13. A method for manufacturing the optoelectronic component according to claim 12, the method comprising:
providing the carrier with the mounting area;
forming the dielectric protective layer on the mounting area in the chip mounting region of the mounting area;
applying the optoelectronic semiconductor chip to the protective layer;
electrically connecting the semiconductor chip with the carrier; and
applying the encapsulation directly to the mounting area in the regions adjacent the chip mounting region and directly to the protective layer in the overlap region,
wherein the encapsulation is exclusively arranged in the regions adjacent the semiconductor chip.

14. The method according to claim 13, wherein forming the dielectric protective layer comprises using a shadow mask for applying the protective layer in predefined regions of the carrier.

15. The method according to claim 13, wherein applying the encapsulation comprises using a further shadow mask for applying the encapsulation in predefined regions of the carrier.

16. The method according to claim 13, wherein the protective layer is formed from an inorganic material.

17. An optoelectronic component comprising:
a carrier with a mounting area;
an optoelectronic semiconductor chip;
a dielectric protective layer; and
a dielectric encapsulation,
wherein the protective layer is directly located at the mounting area in a chip mounting region,
wherein the semiconductor chip is located at the protective layer in the chip mounting region and is electrically conductively connected with the carrier,
wherein the encapsulation is directly located at the mounting area in regions adjacent to the chip mounting region and is directly located at the protective layer in an overlap region,
wherein the encapsulation is arranged exclusively in regions adjacent to the semiconductor chip, and
wherein the encapsulation is a layer comprising a constant thickness over its entire extension with deviations of at most 30% from an average thickness.

* * * * *